US012672392B2

(12) United States Patent
Wang et al.

(10) Patent No.: US 12,672,392 B2
(45) Date of Patent: Jun. 30, 2026

(54) LIGHT-EMITTING DEVICE AND DISPLAY APPARATUS

(71) Applicant: BOE Technology Group Co., Ltd., Beijing (CN)

(72) Inventors: Can Wang, Beijing (CN); Minghua Xuan, Beijing (CN); Xuan Liang, Beijing (CN); Xue Dong, Beijing (CN); Qi Qi, Beijing (CN); Mingkun Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 654 days.

(21) Appl. No.: 18/022,918

(22) PCT Filed: May 23, 2022

(86) PCT No.: PCT/CN2022/094409
§ 371 (c)(1),
(2) Date: Feb. 23, 2023

(87) PCT Pub. No.: WO2023/225782
PCT Pub. Date: Nov. 30, 2023

(65) Prior Publication Data
US 2024/0274586 A1     Aug. 15, 2024

(51) Int. Cl.
*H10H 20/813*       (2025.01)
*H10H 20/814*       (2025.01)
(Continued)

(52) U.S. Cl.
CPC ...... *H10H 20/8131* (2025.01); *H10H 20/814* (2025.01); *H10H 20/857* (2025.01); *H10W 90/00* (2026.01)

(58) Field of Classification Search
None
See application file for complete search history.

(56) References Cited

U.S. PATENT DOCUMENTS

2004/0061433 A1*   4/2004   Izuno ................. H10H 20/8511
                                            257/E33.061
2005/0067627 A1    3/2005   Shen et al.
                    (Continued)

FOREIGN PATENT DOCUMENTS

CN          1490888 A     4/2004
CN        102169885 A     8/2011
CN        113871517 A    12/2021

*Primary Examiner* — Feifei Yeung Lopez
(74) *Attorney, Agent, or Firm* — WHDA, LLP

(57) ABSTRACT

The present application provides a light-emitting device, a display apparatus, the light-emitting device including: a substrate; at least two light-emitting units, in a direction perpendicular to the plane where the substrate is located, orthographic projections of two adjacent light-emitting units on the substrate overlap; at least one patterned bonding layer, located between two adjacent light-emitting units, including a plurality of spaced bonding portions, the bonding portions are configured to be fixed and electrically connected to the two adjacent light-emitting units; the orthographic projection of the bonding portion on the substrate is within the orthographic projection of the light-emitting unit on the substrate, and the sum of the orthographic projection areas of all bonding portions on the substrate is less than the area of the orthographic projection of the light-emitting device on the substrate. Embodiments of the present application provide a light-emitting device with high luminous efficiency and preferable wavelength uniformity.

20 Claims, 11 Drawing Sheets

(51) Int. Cl.
 *H10H 20/857* (2025.01)
 *H10W 90/00* (2026.01)

(56) References Cited

U.S. PATENT DOCUMENTS

| | | | | |
|---|---|---|---|---|
| 2008/0190479 A1 * | 8/2008 | Hsieh | .................... | H10F 10/142 |
| | | | | 136/246 |
| 2011/0186876 A1 | 8/2011 | Suzuki et al. | | |
| 2019/0053347 A1 * | 2/2019 | Lee | .................... | H01L 21/6835 |
| 2020/0402964 A1 | 12/2020 | Kim | | |
| 2024/0063611 A1 * | 2/2024 | Resnick | .................. | H01T 13/20 |

* cited by examiner 93
92
91

93
92
91

93
92
91

93
92
91

930
920
910

930
920
910

Heat and Pressure

93
92
91

92
91

92
91

92
91

LIGHT-EMITTING DEVICE AND DISPLAY APPARATUS

FIELD

The present application relates to the field of display technology and, more particularly, to a light-emitting device and a display apparatus.

BACKGROUND

With the rapid development of display technology, display products including Mini LEDs (Mini light-emitting diode, also refers to submillimeter light-emitting diode) and Micro LEDs (Micro light-emitting diode) have attracted widespread attention. However, the two LED chips in the related art have limited luminous efficiency. In addition, due to the drawback of the preparation process, the wavelength of emitted light at different locations of a chip is not uniform.

SUMMARY

Embodiments of the present application discloses the following technical solutions:

In a first aspect, embodiments of the present application provide a light-emitting device, including:

a substrate;

at least two light-emitting units, wherein, in a direction perpendicular to the plane where the substrate is located, orthographic projections of two adjacent light-emitting units on the substrate overlap;

at least one patterned bonding layer, located between two adjacent light-emitting units, wherein the patterned bonding layer comprises a plurality of spaced bonding portions, the bonding portions are configured to be able to fix and electrically connect the two adjacent light-emitting units; wherein an orthographic projection of the bonding portion on the substrate is located within the orthographic projection of the light-emitting unit on the substrate, and the sum of areas of the orthographic projections of all the bonding portions on the substrate is less than the area of an orthographic projection of a light-emitting surface of the light-emitting device on the substrate.

In some embodiments, the sum of the areas of the orthographic projections of all the bonding portions on the substrate is less than or equal to 50% of the area of the orthographic projection of the light-emitting surface of the light-emitting device on the substrate.

In some embodiments, the light-emitting device further includes a plurality of light-transmitting portions, one of the light-transmitting portions fills the space between two adjacent bonding portions.

In some embodiments, the light-emitting device comprises two light-emitting units and one bonding layer, or the light-emitting device comprises at least three light-emitting units and at least two bonding layers: wherein orthographic projections of the bonding layers on the substrate overlap with each other.

In some embodiments, the bonding portion comprises a first sublayer and a second sublayer, and a material of the first sublayer and a material of the second sublayer are configured to be able to diffuse into the each other under a first preset condition.

In some embodiments, an interface between the first sublayer and the second sublayer is a plane, and the plane is disposed parallel to the plane where the substrate is located.

In some embodiments, at least part area of the interface of the first sublayer and the second sublayer has a preset angle with the plane where the substrate is located, and the preset angle is larger than 0° and less than 180°.

In some embodiments, under the condition that the material of the first sublayer and the material of the second sublayer are the same, the material of the first sublayer and the material of the second sublayer are any one of gold, copper and aluminum;

under the condition that the material of the first sublayer and the material of the second sublayer are different, the material of the first sublayer is silver, and the material of the second sublayer is gold.

In some embodiments, the bonding portion comprises a first sublayer, a second sublayer and a third sublayer, the second sublayer is located between the first sublayer and the third sublayer, a material of the first sublayer is the same as a material of the third sublayer, and a material of the second sublayer is configured to form eutectic crystals with the material of the first sublayer and the material of the third sublayer, respectively, under a second preset condition.

In some embodiments, an interface between the first sublayer and the second sublayer is a first interface, an interface between the second sublayer and the third sublayer is a second interface, and the first interface and the second interface are parallel.

In some embodiments, the first interface is parallel to the plane where the substrate is located;

or, at least part area of the first interface has a preset angle with the plane where the substrate is located, and the preset angle is larger than 0° and less than 180°.

In some embodiments, under the condition that a preset angle exists between at least part area of the first interface and the plane where the substrate is located, an outer contour of an orthographic projection of the third sublayer on the substrate is located within an outer contour of an orthographic projection of the second sublayer on the substrate, and an orthographic projection of the second sublayer on the substrate is located within an orthographic projection of the first sublayer on the substrate.

In some embodiments, each of the first sublayer and the second sublayer has a U-shape section in the direction perpendicular to the plane where the substrate is located, and the third sublayer has a rectangular section in the direction perpendicular to the plane where the substrate is located.

In some embodiments, the first sublayer has an arc-shaped section in the direction perpendicular to the plane where the substrate is located, the second sublayer has a hexagonal section in the direction perpendicular to the plane where the substrate is located, and the third sublayer has a pentagonal section in the direction perpendicular to the plane where the substrate is located.

In some embodiments, a material of the first sublayer and a material of the third sublayer are any one of gold, silver, platinum, tin and copper, and a material of the second sublayer is tin or indium;

under the condition that the material of the second sublayer is tin, the material of the first sublayer and the material of the third sublayer are any one of gold, silver and copper; under the condition that the material of the second sublayer is indium, the material of the first sublayer and the material of the third sublayer are any one of gold, silver, platinum and tin.

In some embodiments, the light-emitting device further comprises a first conducting layer located between one of the light-emitting units and the bonding portion, and a second conducting layer located between another one of the light-emitting units and the bonding portion, the bonding portion is electrically connected to one of the light-emitting units via the first conducting layer, and the bonding portion is electrically connected to another one of the light-emitting units via the second conducting layer.

In some embodiments, the light-emitting device further comprises a first auxiliary layer located between the first conducting layer and the bonding portion, and a second auxiliary layer between the second conducting layer and the bonding portion, the first auxiliary layer and the second auxiliary layer are configured to be able to improve the adhesion between the bonding portion and the first conducting layer and the adhesion between the bonding portion and the second conducting layer.

In some embodiments, wherein the light-emitting device further comprises a reflecting layer and a first Bragg mirror, and the light-emitting unit is located between the reflecting layer and the first Bragg mirror;

in the direction perpendicular to the plane where the substrate is located, the distance between the reflecting layer and a light-emitting surface of the light-emitting device is larger than the distance between the first Bragg mirror and the light-emitting surface of the light-emitting device, and the first Bragg mirror is configured to be able to reflect part of the light and transmit part of the light.

In some embodiments, the reflecting layer comprises a second Bragg mirror, each of the first Bragg mirror and the second Bragg mirror comprising a silica sublayer and a titanium oxide sublayer disposed alternately.

In some embodiments, the light-emitting device further comprises a first electrode and a metal connecting layer, the first electrode is located at the side of the first Bragg mirror away from the substrate, and is electrically connected to the light-emitting unit through a via hole on the first Bragg mirror, and the metal connecting layer is located between the reflecting layer and the substrate:

wherein the reflecting layer and the substrate comprise a conductive material, respectively, and the substrate is configured as a second electrode of the light-emitting device, the substrate is electrically connected with the light-emitting unit via the metal connecting layer and the reflecting layer.

In some embodiments, the light-emitting device further comprises a first electrode, a second electrode and an auxiliary electrode layer;

the light-emitting unit and the second electrode are located on the same side of the auxiliary electrode layer, and the outer contour of the orthographic projection of the second electrode on the substrate does not overlap with the outer contour of the orthographic projection of the light-emitting unit on the substrate, and the second electrode is electrically connected to the light-emitting unit via the auxiliary electrode layer;

wherein the auxiliary electrode layer is located between the reflecting layer and the light-emitting unit, the first electrode is located at the side of the first Bragg mirror away from the light-emitting unit, and is electrically connected to the light-emitting unit through a via hole on the first Bragg mirror;

or, the auxiliary electrode layer is located between the first Bragg mirror and the light-emitting unit, the first electrode is located at the side of the reflecting layer away from the light-emitting unit, and is electrically connected to the light-emitting unit through a via hole on the reflecting layer.

In a second aspect, a display apparatus is provided, the display apparatus includes a light-emitting device and a driving backplane, wherein the light-emitting device is the light-emitting device above, the light-emitting device and the driving backplane are electrically connected with each other.

The description is only an overview of the technical solution of the present application, in order to be able to better understand the technical means of the present application, and can be implemented in accordance with the content of the description, and in order to make the and other purposes, features and advantages of the present application are more obvious and easy to understand, the following specific embodiments of the present application are hereby given.

BRIEF DESCRIPTION OF THE DRAWINGS

In order to more clearly explain the technical solution in the embodiments of the present application or traditional technology, the following will briefly introduce the drawings needed in the embodiments or traditional technology. Obviously, the drawings in the following description are only some embodiments of the present application, and those of ordinary skill in the art may obtain other embodiments based on these drawings without involving any inventive effort.

DETAILED DESCRIPTION

Figures 1, 2:
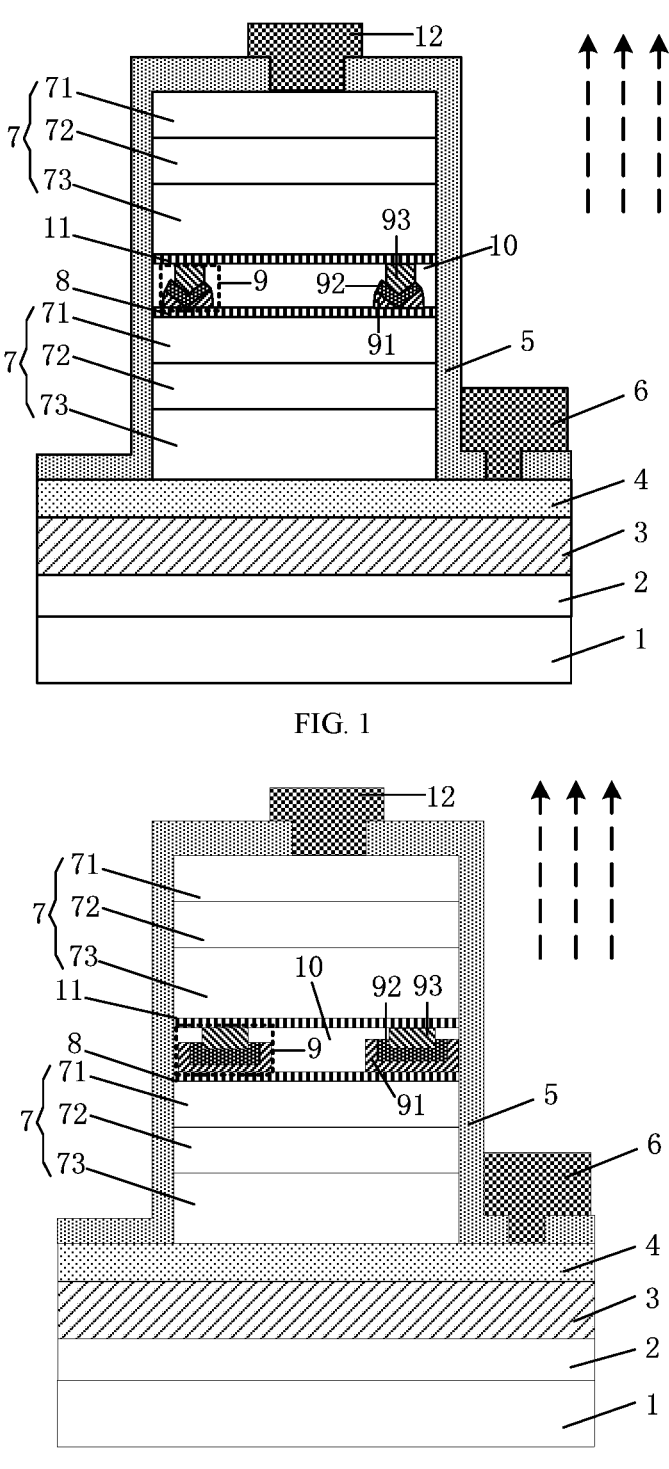
FIG. 1 to FIG. 11 are schematic diagrams showing the structures of eleven types of light-emitting devices according to the embodiments of the present application.

In the following, the accompanying drawings in the embodiment of the present application will be combined, the technical solution in the embodiment of the present application will be clearly and completely described. Obviously, only a part of the embodiments of the present application are described, not all the embodiments. Based on the embodiments in the present application, all other embodiments obtained by those of ordinary skill in the art without performing creative labor fall within the claimed protection scope of the present application.

In the figure, the thickness of the area and layer may be exaggerated for clarity. The same numeric label in the figures indicates the same or similar structure, so that their detailed description will be omitted. Further, the drawings are only illustrative illustrations of the present application and are not necessarily drawn to scale.

In embodiments of the present application, the words "first", "second", "third" and the like are used to distinguish the same or similar terms with substantially the same function and function, only to clearly describe the technical solution of the embodiment of the present application, and cannot be understood as indicating or implying relative importance or implicitly indicating the number of technical features indicated.

In the description of the present application, unless otherwise stated, "plurality" means two or more; The orientation or position relationship indicated by the terms "up", "down", "left", "right", "inside", "outside", etc. is based on the orientation or position relationship shown in the drawings, and is only intended to facilitate the description of the present application and simplify the description, and does not indicate or imply that the machine or element referred to must have a specific orientation, constructed and operated in a specific orientation, and therefore cannot be understood as a limitation of the present application.

Unless otherwise requires, throughout the description and claims, the term "comprising" or "including" are interpreted to mean open, inclusive. i.e. "including, but not limited to". In the description of the specification, the terms "one embodiment", "some embodiments", "exemplary embodiments", "examples", "specific examples" or "some examples" and the like are intended to indicate that the embodiment or example associated with a particular feature, structure, material or characteristic is included in at least one embodiment or example of the present application. The schematic representation of the terms does not necessarily refer to the same embodiment or example. Further, the particular features, structures, materials or characteristics may be included in any appropriate manner in any one or more embodiments or examples.

With the development of display technology, people have higher and higher requirements for the performance of display products. The power consumption of display products has become an important indicator to measure the quality of display products. Among them, for Mini LED (Mini light emitting diode) and Micro LED (Micro light emitting diode) display products, its static power consumption mainly includes the power consumption of TFT, the power consumption of voltage drop (IR Drop) and the power consumption of light-emitting chips. Of which, the light-emitting chip refers to Mini LED chip or Micro LED chip, static power consumption refers to the power consumption of the drive circuit of the display product when the drive circuit is in a stable state. In practical applications, the higher the proportion the power consumption of light-emitting chips occupies in static power consumption, and the higher the electro-optical conversion efficiency of light-emitting chips is, the higher the luminous efficiency of display products is.

In addition, for Mini LED or Micro LED display products, due to the limitations of the preparation process, in the process of preparing Mini LED chips or Micro LED chips, there are slight differences in the wavelength of the emitted light at different locations on the extension layer on the same wafer, which makes the light emitted by the light-emitting chip manufactured from the same wafer not uniform.

Figure 3:
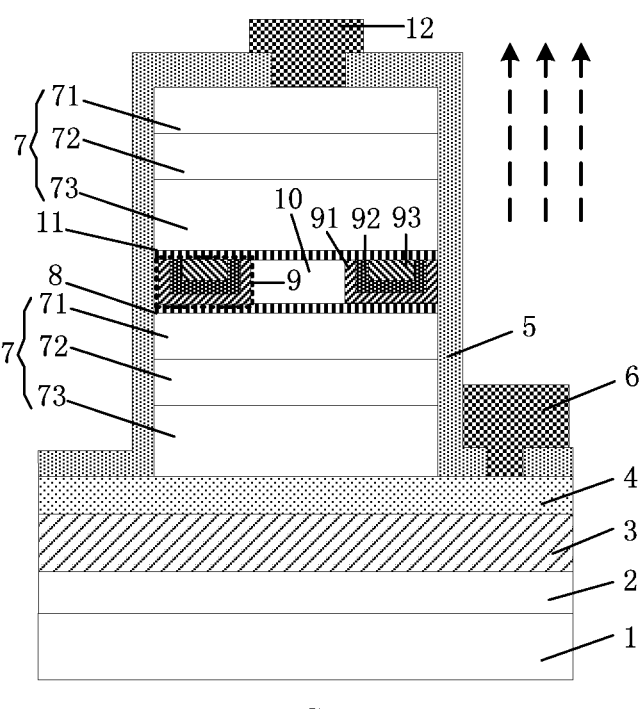
Figure 4:
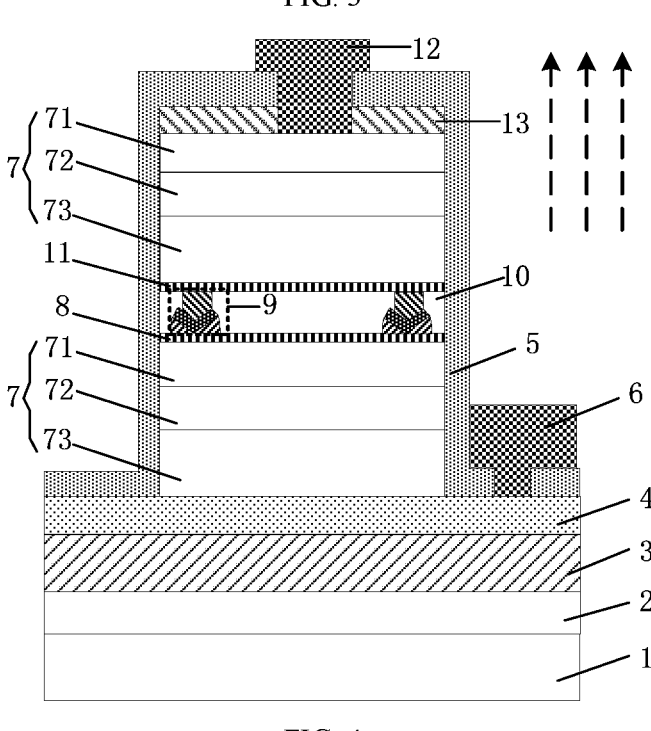

Based on this, embodiments of the present application discloses a light-emitting device, referring to FIG. 1, FIG. 2 or FIG. 3, the light-emitting device includes:

a substrate 1;

at least two light-emitting units 7, in a direction perpendicular to the plane where the substrate 1 is located, orthographic projections of two adjacent light-emitting units 7 on the substrate 1 overlap;

at least one patterned bonding layer located between two adjacent light-emitting units 7, including a plurality of spaced bonding portions 9, the bonding portions 9 is configured to fix and electrically connect two adjacent light-emitting units 7. The orthographic projection of the bonding portion 9 on the substrate 1 is located within the orthographic projection of the light-emitting unit 7 on the substrate 1, and the sum of the areas of the orthographic projection of all the bonding portions 9 on the substrate 1 is less than the area of the orthographic projection of the light-emitting surface of the light-emitting device on the substrate 1.

In the figures according to some embodiments of the present application, the direction indicated by the dotted arrow is the direction in which the light is emitted.

It should be noted that the substrate 1 according to the embodiment of the present application is a three-dimensional structure. However, since the substrate 1 is thin, the substrate 1 can be approximated as a plane, so that for the convenience of description, the description of "the plane where the substrate is located" is adopted, and the similar description in the context is similar to the meaning herein, and will not be repeated for concise purpose.

In an exemplary embodiment, the substrate 1 may be a sapphire substrate, or the substrate 1 may be a silicon substrate.

In practical applications, the substrate 1 may be removed according to actual situation. If the substrate 1 is a sapphire substrate, it can be removed by laser peeling, and if the substrate 1 is a silicon substrate, it can be removed by wet etching process or dry etching process.

In an exemplary embodiment, the thickness of each of the light-emitting unit whose orthographic projections overlap in the direction perpendicular to the plane where the substrate 1 is located is not necessarily the same, and may be determined according to the time situation.

In an exemplary embodiment, the light-emitting unit 7 includes a first semiconductor layer 71, a quantum well layer 72 and a second semiconductor layer 73, the first semiconductor layer 71 may be a P-type semiconductor layer, such as P-type gallium nitride (P-GaN), and the second semiconductor layer 73 may be an N-type semiconductor layer, such as N-type gallium nitride (N-GaN).

In an exemplary embodiment, the luminous colors of the light-emitting units whose orthographic projections overlap in the direction perpendicular to the plane where the substrate 1 is located is the same.

The orthographic projection of the light-emitting unit 7 on the substrate 1 refers to the projection of the light-emitting unit 7 on the substrate 1 in a direction perpendicular to the plane where the substrate 1 is located, and the meaning of related descriptions of orthographic projection in the following text is similar to that here, and will not be repeated.

In an exemplary embodiment, the light-emitting device may include two light-emitting units having overlapped orthographic projections, or, the light-emitting device may include three stacked light-emitting units.

Herein, at least one patterned bonding layer is located between two adjacent light-emitting units, means that the orthographic projection of the bonding layer in the direction perpendicular to the plane wherein the substrate is located is between two overlapped light-emitting units.

In an exemplary embodiment, the number of bonding layers is equal to the number of stacked light-emitting units 7 minus 1. Exemplary, the light-emitting device includes: setting one bonding layer under the condition that under the condition that there are two overlapping orthography projection of light-emitting units 7 in the direction perpendicular to the plane where the substrate 1 is located; alternatively, setting two bonding layers under the condition that there are three under the condition that overlapping orthography projection of the light-emitting device. Wherein the bonding layer is located between any two adjacent light-emitting units 7 for electrically connecting and fixing the two adjacent light-emitting units 7.

The number of bonding portions 9 included in the same bonding layer is not limited here, and can be determined according to the actual situation.

In an exemplary embodiment, in the direction parallel to the plane where the substrate 1 is located, there is a gap between each two adjacent bonding portions, and the size of the gap between the two adjacent bonding portions is not limited.

For example, under the condition that the bonding layer can ensure stable fixation and stable electrical connection between adjacent light-emitting units 7 in the direction perpendicular to the plane where the substrate 1 is located, the size of the gap between the two adjacent bonding portions is as large as possible to improve the transmittance of light.

In an exemplary embodiment, the gap between each two adjacent bonding portions may be set to hollow; alternatively, the gap can be filled with light-transmitting material.

In an exemplary embodiment, the material of the bonding portion includes a conductive material. Exemplary, the conductive material may include at least one of metallic materials, for example, may be gold (Au), copper (Cu), Aluminum (Al), Platinum (Pb), Silver (Ag), Indium (In), Tin (Sn) and so on.

In an embodiment of the present application, the sum of the areas of the orthographic projection of all bonding portions 9 on the substrate 1 is less than the area of the orthographic projection of the light-emitting surface of the light-emitting device on the substrate 1, herein, the light-emitting surface refers to the side of the light emitting device for emitting lights.

In the embodiments of the present application, the light-emitting devices may include Mini LED or Micro LED. The size of the Mini LED is between 100 µm-300 µm, and the size of the Micro LED is between 0 µm-100 µm.

In the light-emitting device provided in the embodiments of the present application, by disposing a bonding layer between two adjacent light-emitting units 7 in the direction perpendicular to the plane where the substrate 1 is located, the bonding layer comprises a plurality of spaced bonding portions 9, the light-emitting units 7 is fixed and electrically connected with one another by a bonding layer, and the orthographic projections of the light-emitting units 7 on the substrate 1 overlaps, and therefore, a way to stack a plurality of light-emitting units 7 are provided, which can improve the light output efficiency of light-emitting devices while improving the wavelength uniformity of the emitted light of the light-emitting device.

Figure 18A:
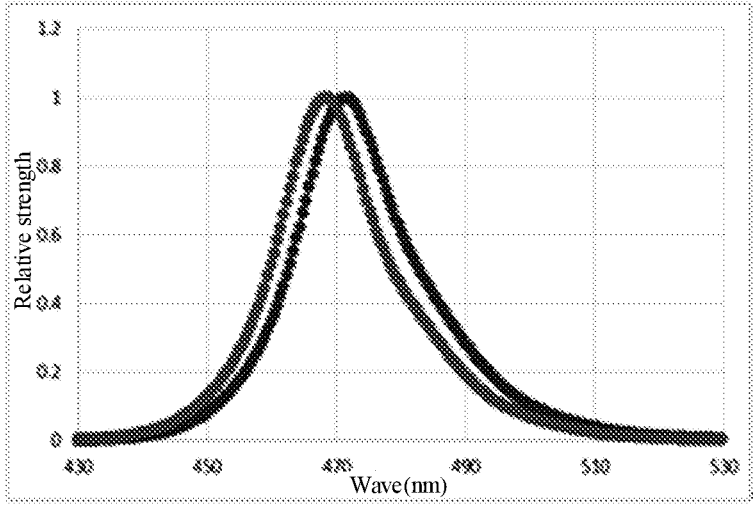
FIG. 18A shows spectral curves of two blue light-emitting units in the related technology according to some embodiments of the present application.
Figure 18B:
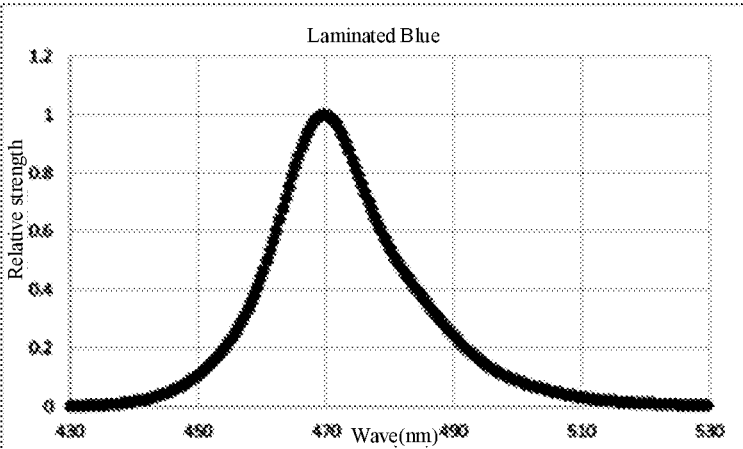
FIG. 18B shows the luminescence spectrum of the light-emitting device formed after two blue light-emitting units are bonded together using the bonding layer in the related technology provided by the embodiment of the present application.

FIG. 18A provides the spectral curves of the two blue light-emitting units in the related technology, and it can be seen that the luminescence spectrums of the two blue light-emitting units are not completely the same, and the wavelength uniformity is not preferable. FIG. 18B shows a luminescence spectrum of the light-emitting device formed after bonding two blue light-emitting units with a bonding layer according to an embodiment of the present application, it can be seen that the problem of poor wavelength uniformity is significantly improved.

In some embodiments of the present application, the sum of the areas of the orthographic projection of all bonding portions on the substrate 1 is less than or equal to 50% of the area of the orthographic projection of the light emitting surface of the light-emitting device on the substrate 1.

In an embodiment of the present application, when the light-emitting device emits light, the light path passes through the bonding layer, the more bonding portions in the bonding layer is, the lower the brightness of the light actually emitted by the light-emitting device is, so that in practical applications, in order to balance the fixed and electrical connection effect of the bonding portion on each light-emitting unit and the influence of the bonding portion on the brightness, the sum of the areas of the orthographic projection of all bonding portions on the substrate 1 is set to be less than or equal to 50% of the area of the orthographic projection of the light-emitting device on the substrate 1 In this way, while improving the problem of poor wavelength uniformity of the light emitted by the light-emitting device, and improving the luminous efficiency of the light-emitting device, the luminous brightness of the light-emitting device may also be guaranteed.

In some embodiments of the present application, referring to FIG. 1 to FIG. 3, the light-emitting device further comprises a plurality of light transmission portions 10, the light transmission portion 10 is filled in the space between two adjacent bonding portions 9.

In an embodiment of the present application, for a light-emitting unit away from the light emitting surface, the light needs to pass through at least one bonding layer after emitting, and for the space between two adjacent bonding portions in the bonding layer, the transmittance portion 10 may be set, and according to the refractive index relationship of the film layer in the actual product, the light-transmitting material of the light transmission part 10 is determined, so as to avoid the light loss caused by the reflection of light between the film layers, improve the emission rate of light, and thereby improving light utilization and luminosity.

Figures 7, 8:
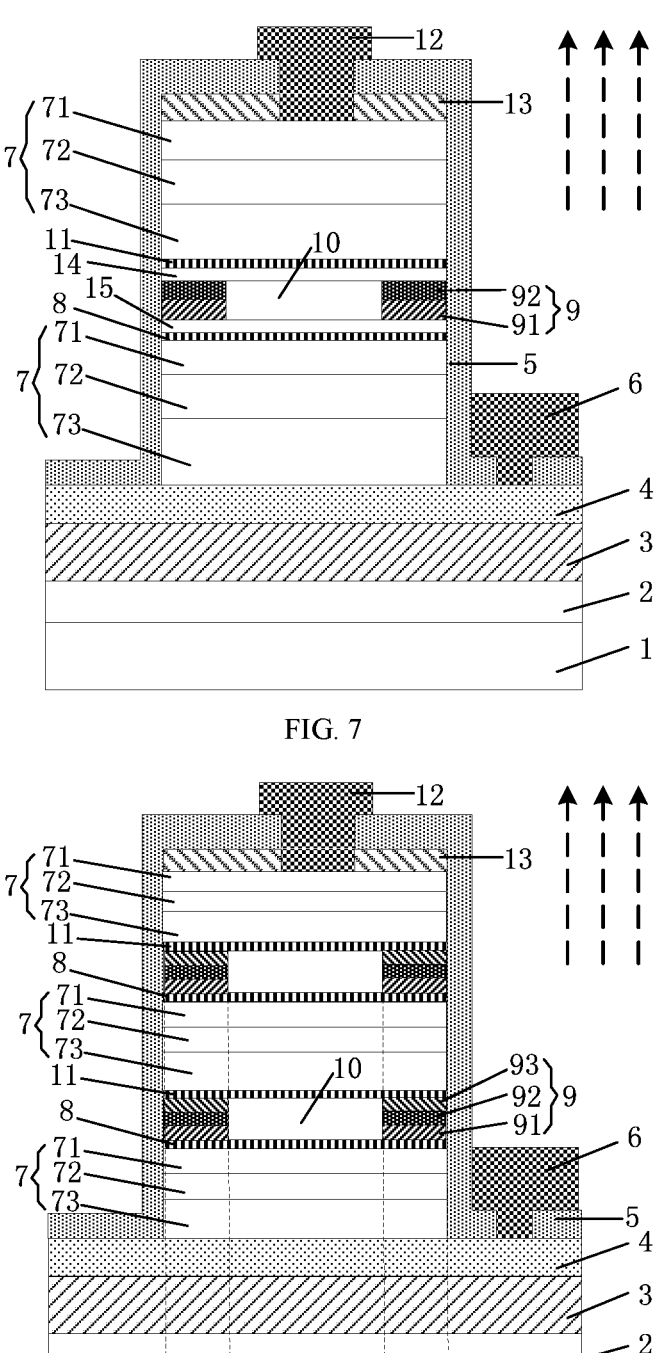

In some embodiments of the present application, with reference to FIG. 1 to FIG. 3, the light-emitting device includes two light-emitting units and a bonding layer; or, referring to FIG. 8, the light-emitting device includes at least three light-emitting units 7 and at least two bonding layers; the orthographic projections S1 of the bonding layers on the substrate 1 overlap.

In an exemplary embodiment, under the condition that under the condition that the orthographic projections S1 of the bonding layers on the substrate 1 overlap, the sum of the areas of the orthographic projections of all the bonding layers on the substrate 1 is equal to the area of the orthographic projection of one bonding layer on the substrate 1.

In an embodiment of the present application, when the light-emitting device includes at least two bonding layers, by setting the orthographic projections S1 of the bonding layers to be overlap on the substrate 1, on the substrate 1 the sum of the areas of the orthographic projection of the bonding layers on the substrate 1 is as small as possible, so that the amount of the emitted light of the light-emitting device can be increased, thereby improving the brightness and light utilization of the light-emitting device.

Figures 5, 6:
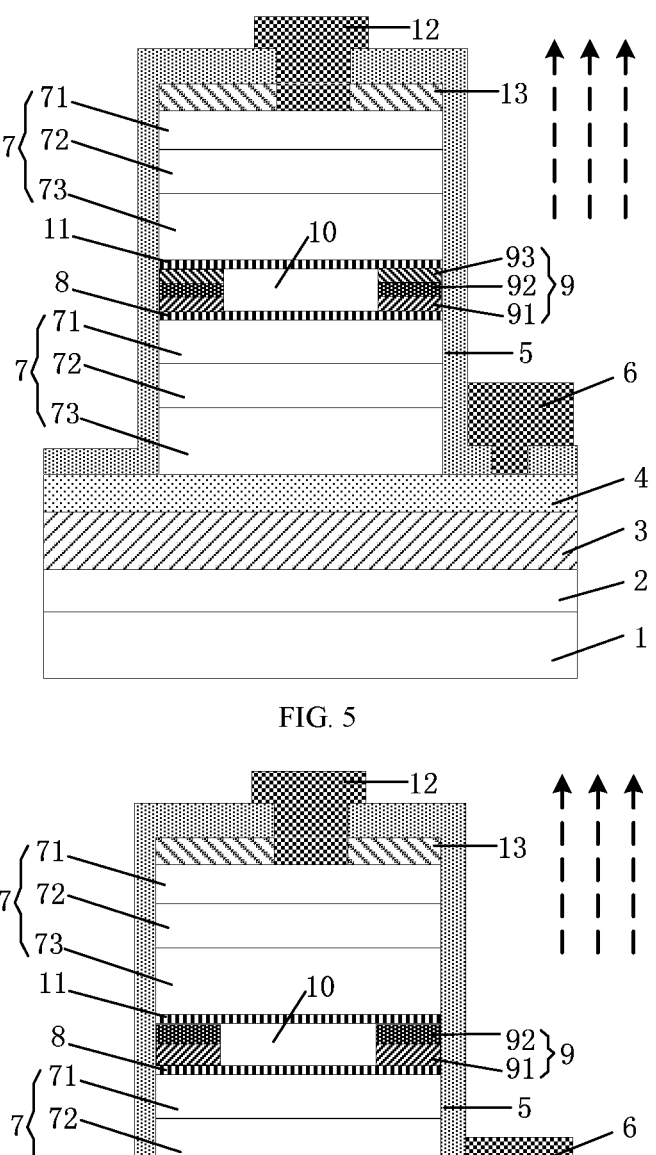

In some embodiments of the present application, with reference to FIG. 6, the bonding portion 9 includes a first sublayer 91 and a second sublayer 92, a material of the first sublayer 91 and a material of the second sublayer 92 is configured to diffuse into each other's material under a first preset condition.

In an exemplary embodiment, under the condition that the bonding portion 9 including two sublayers, the materials in the two sublayers are connected together by solid-phase diffusion welding (also known as solid-phase diffusion connection or solid-state diffusion connection). In practical applications, the two sublayers may be pressed together, placed in a vacuum or protective atmosphere, heated to a temperature below the melting point, and applied to pressure, so that a microplastic deformation occurs at the interface of the two sublayers, so as to closely bond the two sublayers. Then after a thermal insulation process, the atoms in the two sublayers diffuse to each other to form a solid metallurgical structure. Simply to say, it is to make the material in the two sublayers integrate with each other.

In an exemplary embodiment, the first preset condition may be: placing in a vacuum or protective atmosphere, heating to a temperature below the melting point, and applying a certain pressure. In practical applications, according to the material selection of the first sublayer 91 and the second sublayer 92, the pressure applied, the temperature of heating and the time of thermal insulation may be different.

Here the thickness of the first sublayer 91 and the thickness of the second sublayer 92 are not limited, and they may be determined according to the actual situation.

Figure 15A:
FIG. 15A, FIG. 15B, and FIG. 15C are schematic structural diagrams showing three types of bonding portions including two sublayers according to some embodiments of the present application.
Figure 15B:
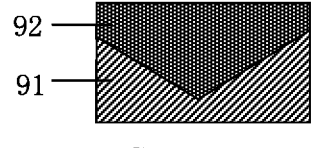
Figure 15C:

In some embodiments of the present application, with reference to FIG. 6, FIG. 7 and FIG. 15 A. the interfaces of the first sublayer 91 and the second sublayer 92 are plane, and the plane is disposed parallel to the substrate 1.

In some embodiments of the present application, referring to FIG. 15B and FIG. 15 C, at least part area of the interface of the first sublayer 91 and the second sublayer 92 has a preset angle with respect to the plane where the substrate 1 is located, and the preset angle is larger than 00 and less than 180°.

In an exemplary embodiment, at least part area of the interface of the first sublayer 91 and the second sublayer 92 has a preset angle with respect to the plane where the substrate 1 is located, and the angle may be an acute angle, a right angle or an obtuse angle.

In an embodiment of the present application, the interface is disposed to be a plane not completely parallel to the substrate 1, thereby further improving the firmness of the connection between the first sublayer 91 and the second sublayer 92 in the bonding portion 9. In addition, the reliability of the light-emitting device is improved, to avoid an unstable fix or unstable electrical connection between two adjacent light-emitting units 7 along the direction perpendicular to the plane where the substrate 1 in the subsequent process or actual use. The "not completely parallel to the substrate 1" refers to a case other than a plane that is completely parallel to the substrate 1. For example, a part of the interface may be parallel to the substrate 1, another part of the interface has an angle with respect to the substrate 1.

In some embodiments of the present application, as shown in Table 1 below, under the condition that the material of the first sublayer 91 and the material of the second sublayer 92 are the same, the material of the first sublayer 91 and the material of the second sublayer 92 are gold (Au), copper (Cu) or aluminum (Al); under the condition that the material of the first sublayer 91 is different from the material of the second sublayer 92, the material of the first sublayer 91 is silver (Ag), and the material of the second sublayer 92 is gold (Au).

TABLE 1

| the matched material of the first sublayer and second sublayer in the bonding portion | | | | | |
|---|---|---|---|---|---|
| | | material | | | |
| Solid-phase diffusion | First sublayer | Au | Cu | Ag | Al |
| | Second sublayer | Au | Cu | Au | Al |

It is for sure that, the matched material of the first sublayer 91 and the second sublayer 92 in the bonding portion according to some embodiments of the present application is listed in Table 1, but it is not limited. The matched material may also be determined according to the actual situation.

In addition, it should be noted that, for the materials of the first sublayer 91 and the second sublayer 92 of the bonding portion provided by the present application, the temperature range may be 100° C.~200° C. when performing solid-phase diffusion welding in actual welding process. 10.

In some embodiments of the present application, referring to FIG. 1 to FIG. 5 and FIG. 8 to FIG. 13D, the bonding portion 9 includes a first sublayer 91, a second sublayer 92 and a third sublayer 93, the second sublayer 92 is located between the first sublayer 91 and the third sublayer 93, the material of the first sublayer 91 and the material of the third sublayer 93 are the same, and the material of the second sublayer 92 is configured to be able to form eutectic crystals with the material of the first sublayer 91 and the material of the third sublayer 93 under a second preset condition, respectively.

In an exemplary embodiment, since the material of the first sublayer 91 and the material of the third sublayer 93 are the same, the positions of the two are interchangeable.

Figure 14A:
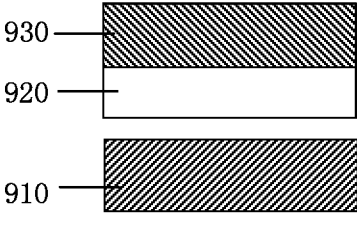
FIG. 14A, FIG. 14B and FIG. 14C are schematic diagrams showing a bonding principle according to some embodiments of the present application.
Figure 14B:
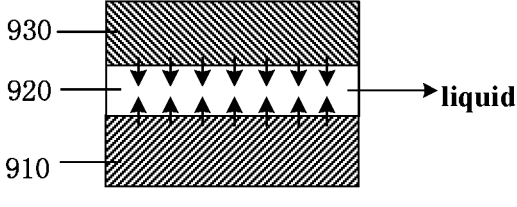
Figure 14C:
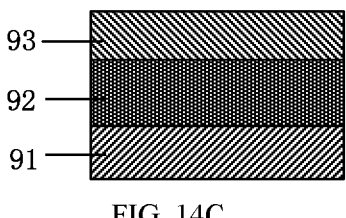

Under the condition that the bonding port 9 includes three sublayers, the materials in the three sublayers are joined together by solid-liquid diffusion welding (also known as solid-liquid diffusion connection). In practical applications, referring to FIG. 14A, the middle layer 920 is disposed between the first metal layer 910 and the second metal layer 930, and referring to FIG. 14B, a certain pressure is applied and heating is performed under oxygen-free conditions. Taking the material of the first metal layer 910 and the material of the second metal layer 930 to be copper (Cu) and the material of the middle layer 920 is tin (Sn) as an example, copper and tin diffuse into each other, and part of the tin becomes liquid and fills between the first metal layer 910 and the second metal layer 930, during the thermal insulation phase, the liquid tin diffuses into the copper on both sides and makes the first metal layer 910 and the second metal layer 930 gradually dissolves, and finally, refer to FIG. 14C, the formed alloy liquid cools and crystallizes to form a second sublayer 92, the remaining metal in the first metal layer 910 and the second metal layer 930 form the first sublayer 91 and the third sublayer 93.

The second sublayer 92 includes eutectic crystals formed by alloy liquids, such as crystal mixtures of copper and tin.

In an exemplary embodiment, the second preset condition is to apply a certain pressure and heat in an oxygen-free environment, so that the second sublayer 92 may change from a solid phase to a liquid phase.

The thicknesses of the first sublayer 91, the second sublayer 92 and the third sublayer 93 are not limited, and can be determined according to the actual situation.

In some embodiments of the present application, with reference to FIG. 1 to FIG. 5, and FIG. 8 to FIG. 13D, the interface between the first sublayer 91 and the second sublayer 92 is a first interface, and the interface between the second sublayer 92 and the third sublayer 93 is the second interface, and the first interface and the second interface are parallel.

Figure 13A:
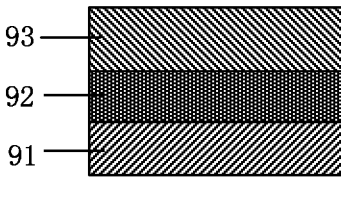
FIG. 13A, FIG. 13B, FIG. 13C and FIG. 13D are schematic diagrams showing four types of bonding portions including three sublayers according to some embodiments of the present application.
Figure 13B:
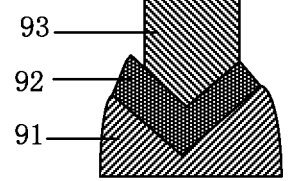
Figure 13C:
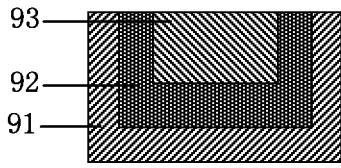
Figure 13D:
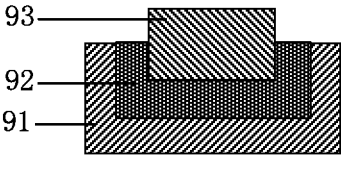

In some embodiments of the present application, with reference to FIG. 13A, the first interface is parallel to the plane where the substrate 1 is located, or, referring to FIG. 13B figure. FIG. 13C and FIG. 13D, at least part area of the first interface has a preset angle with respect to the plane where the substrate 1 is located, and the preset angle is larger than 0° and less than 180°.

In some embodiments, the preset angle may be acute angle, right angle or obtuse angle.

In some embodiments of the present application, under the condition that a preset angle between at least part area of the first interface and the plane where the substrate 1 is located, refer to FIG. 13B, FIG. 13 C and FIG. 13D, the outer contour of the orthographic proception of the third sublayer 93 on the substrate 1 is located within the outer contour of the orthographic projection of the second sublayer 92 on the substrate 1, and the orthographic projection of the second sublayer 92 on the substrate 1 is located within the orthographic projection of the first sublayer 91 on the substrate 1.

Wherein, the situation that the orthographic projection of the second sublayer 92 on the substrate 1 is located within the orthographic projection of the first sublayer 91 on the substrate 1 includes: refer to FIG. 13C and FIG. 13D, the outer contour of the orthographic projection of the second sublayer 92 on the substrate 1 is located within the outer contour of the orthographic projection of the first sublayer 91 on the substrate 1, or, the outer contour of the orthographic projection of the second sublayer 92 overlap with the outer contour of the orthographic projection of the first sublayer 91 on the substrate 1.

In some embodiments of the present application, with reference to FIG. 13C and FIG. 13D, the sections of the first sublayer 91 and the second sublayer 92 along the direction perpendicular to the surface where the substrate 1 is located are U-shaped, and the section of the third sublayer 93 along the direction perpendicular to the surface where the substrate 1 is located is rectangular.

In some embodiments of the present application, with reference to FIG. 13B, the section of the first sublayer 91 is arc-shaped along direction perpendicular to the plane where the substrate 1 is located, and the section of the second sublayer 92 is hexagonal along the direction perpendicular to the plane where the substrate 1 is located, and the section of the third sublayer 93 is a pentagonal along the direction perpendicular to the plane where the substrate 1 is located.

In some embodiments of the present application, the material of the first sublayer 91 and the material of the third sublayer 93 are one of gold (Au), silver (Ag), platinum (Pb), tin (Sn) or copper (Cu), the material of the second sublayer 92 is one of tin (Sn) or indium (In); under the condition that the material of the second sublayer 92 is tin (Sn), the material of the first sublayer 91 and the material of the third sublayer 93 are one of gold (Au) and silver (Ag) and copper (Cu); under the condition that the material of the second sublayer 92 is indium (In), the material of the first sublayer 91 and the material of the third sublayer 93 are one of gold (Au), silver (Ag), platinum (Pb) and tin (Sn).

TABLE 2

Material match and corresponding process temperatures of the first, second and third sublayers in the bonding portion

| | | material | | | | | | |
|---|---|---|---|---|---|---|---|---|
| Solid-liquid diffusion | first sublayer | Au | Ag | Pb | Sn | Cu | Au | Ag |
| | second sublayer | In | In | In | In | Sn | Sn | Sn |
| | third sublayer | Au | Ag | Pb | Sn | Cu | Au | Ag |
| | process temperature ° C. | 160 | 180 | 200 | 120 | 280 | 280 | 250 |

It is for sure that, the material matching of the first sublayer 91, the second sublayer 92 and the third sublayer 93 in the bonding portion provided according to embodiments of the present application is not limited to those listed in Table 2, which may also be determined according to the actual situation.

Further, it should be noted that the temperature range of the material of the first sublayer 91, the second sublayer 92 and the third sublayer 93 of the bonding portion provided by the present application 12 may be between 120-280° C. during performing liquid-solid diffusion welding in actual application. For details, it is capable to refer to the temperatures listed in Table 2, the temperature provided in Table 2 is the core temperature, and the actual temperature used may fluctuate based on the core temperature.

In some embodiments of the present application, with reference to FIG. 1 to FIG. 3, the light-emitting device further includes a first conducting layer 8 located between one light-emitting unit 7 and the bonding portion 9, and a second conducting layer 11 located between another 11 light-emitting unit 7 and the bonding portion 9. The bonding portion 9 is electrically connected to a light-emitting unit 7 via the first conducting layer 8, and the bonding portion 9 is electrically connected to another light-emitting unit 7 via a second conducting layer 11.

Wherein the orthographic projection of the second conducting layer 11 on the substrate 1 overlaps with the orthographic projection of the first conducting layer 8 on the substrate 1.

In some embodiments, the orthographic projection of the first conducting layer 8 on the substrate 1 overlaps with the orthographic projections of the bonding portions 9 in the same bonding layer on the substrate 1, and the orthographic projection of the first conducting layer 8 on the substrate 1 and the orthographic projections of the transmittance portion 10 on the substrate 1 do not overlap with each other. That is, the first conducting layer 8 is only provided between the bonding portion 9 and the light-emitting unit, and the first conducting layer 8 is not provided between the light-transmitting portion 10 and the light-emitting unit 7. The situation of the second conducting layer 11 is similar to the first conducting layer 8, which will not be repeated here.

Or, in some other embodiments, referring to FIG. 1, the orthographic projection of the first conducting layer 8 on the substrate 1 overlap with the orthographic projections of the bonding portions 9 in the same bonding layer on the substrate 1, and the orthographic projection of the first conducting layer 8 on the substrate 1 overlap with the orthographic projections of transmittances 10 on the substrate 1. That is to say, a first conducting layer 8 is provided between the bonding portion 9 and the light-emitting unit 7, and between the light transmission portion 10 and the light-emitting unit 7. The situation of the second conducting layer 11 is similar to the first conducting layer 8, which will not be repeated here.

In an exemplary embodiment, the materials of the first conducting layer 8 and the second conducting layer 11 are light-transmitting conductive material, and for example, the light-transmitting conductive material may be indium tin oxide (ITO) or indium zinc oxide (IZO).

In practical applications, under the condition that the light transmittance of the light-emitting device meets the requirements, in order to reduce the difficulty of the preparation process, with reference to FIG. 1, the first conducting layer 8 may be provided between the bonding portion 9 and one light-emitting unit 7, and between the light-transmitting portion 10 and one light-emitting unit 7, and the second conducting layer 11 may be provided between the bonding portion 9 and another light-emitting unit 7, and the light transmitting portion and the another light-emitting unit 7.

In some embodiments of the present application, as shown in FIG. 7, the light-emitting device further includes a first auxiliary layer 15 located between the first conducting layer 8 and the bonding portion 9, and a second auxiliary layer 14 located between a second conducting layer 11 and the bonding portion 9, the first auxiliary layer 15 and the second auxiliary layer 14 are configured to be able to increase the adhesion between the bonding portion 9 and the conducting layer (the first conducting layer 8 or the second conducting layer 11).

In an exemplary embodiment, the material of the first auxiliary layer 15 and the second auxiliary layer 14 includes tungsten titanide (TiW).

Here the thickness of the first auxiliary layer 15 and thickness of the second auxiliary layer 14 are not limited, and may be determined according to the actual situation.

In some embodiments of the present application, by disposing a first auxiliary layer 15 and a second auxiliary layer 14, the adhesion between the bonding portion 9 and the conducting layer can be improved, thereby increasing the fixing ability of the bonding portion 9 to two adjacent light-emitting units 7 in the direction perpendicular to the substrate 1, to improve the reliability and electrical connection stability of the light-emitting device.

In an exemplary embodiment, referring to FIG. 1 to FIG. 3, the light-emitting device further includes a reflecting layer 3 and a connecting layer 2, the connecting layer 2 is used to fix the reflecting layer 3 and the substrate 1.

For example, the reflecting layer 3 may include metallic materials such as silver (Ag).

For example, the connecting layer 2 may include a bonding resin, such as bonding adhesive.

In an embodiment of the present application, by providing a reflecting layer 3, the light emitted by the light-emitting unit 7 can be reflected to the light-emitting surface of the light-emitting device as much as possible, thereby improving the light utilization rate.

In some embodiments of the present application, with reference to FIG. 4, FIG. 5, FIG. 9 and FIG. 11, the light-emitting device further includes a reflecting layer 3 and a first Bragg mirror 13, and the light-emitting unit 7 is located between the reflecting layer 3 and the first Bragg mirror 13;

In the direction perpendicular to the plane where the substrate 1 is located, the distance between the reflecting layer 3 and the light-emitting surface of the light-emitting device is larger than the distance between the first Bragg mirror 13 and the light-emitting surface of the light-emitting device. The first Bragg mirror 13 is configured to be able to reflect part of the light and transmit part of the light.

It should be understood that the reflecting layer 3 reflects light and is opaque, the reflecting layer 3 is located at the side of the light-emitting unit 7 away from the light emitting surface, and the first Bragg mirror 13 is located at the side of the light emitting unit 7 close to the light emitting surface.

In an exemplary embodiment, the first Bragg mirror 13 may be a semi-transparent and semi-reflective film.

In an exemplary embodiment, the reflecting layer 3 and the first Bragg mirror 13 form an optical resonant cavity, the optical resonant cavity may select incident light. According to the demand of the light color and band in actual application, the cavity length of the optical resonant cavity may be designed, so that the lights with specific wavelengths have interferences in the optical resonator cavity and have constructive interference, so that light with specific wavelength can emit with greater brightness, light with other bands may be repeatedly oscillated in the cavity, to have destructive interference or absorption, that is, the optical resonator cavity may filter the light, which greatly improves the color purity of light, thereby improving the emitting purity of light-emitting devices.

In the following embodiments of the present application, taking the light-emitting device including two light-emitting units or the light-emitting device including three light-emitting units and the light-emitting device is a blue-light light-emitting device as an example, illustration on how to determine the cavity length of the resonant cavity is shown.

Figure 16:
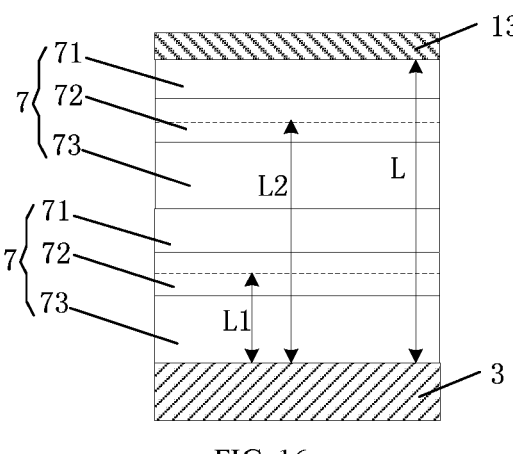
FIG. 16 and FIG. 17 are schematic diagrams showing the principle of two types of resonators according to some embodiments of the present application.

Referring to FIG. 16, the light-emitting device includes two light-emitting units 7, wherein the distance between the emitting layer 3 and the first Bragg mirror 13 is a cavity length L. and the reflecting layer 3 to the center position of the quantum well layer of the first light-emitting unit 7 is L1, and the distance between the reflecting layer 3 to the center position of the quantum well layer of the second light-emitting unit 3 is L2, according to the following formula:

$$\frac{I_{out}}{I} = \frac{T2 * \left(1 + R1 + 2\sqrt{R1}\cos\left(\dfrac{2\omega L1}{c} + \varphi 1\right)\right)}{1 + R1 * R2 - 2\sqrt{R1 * R2}\cos\left(\dfrac{2\omega L}{c} + \varphi 1 + \varphi 2\right)}. \quad \text{Formula (1)}$$

$$\frac{2wL1}{c} + \varphi 1 = m\pi. \quad \text{Formula (2)}$$

$$\frac{2wL2}{c} + \varphi 1 = (m+1)\pi. \quad \text{Formula (3)}$$

$$\frac{2wL}{c} + \varphi 1 + \varphi 2 = (m+n)\pi. \quad \text{Formula (4)}$$

Wherein, in the formula, I is the luminous intensity, Iout is the light-emitting intensity, R1 is the reflectivity of the reflecting layer 3, R2 is the reflectivity of the first Bragg mirror 13, and T2 is the transmittance of the first Bragg mirror 13, w is the frequency of light, c is the speed of light, $\varphi$ is the phase shift generated by reflecting light reflected by layer 3, which $\varphi 1$ is phase shift generated when the reflecting layer reflects light, the $\varphi 2$ is phase shift generated when the first Bragg mirror 13 reflects light, m is the number of cycles of the light oscillating in the resonator, the value of m is 1, 2, 3, 4 . . . , and n is a positive integer.

In the actual simulation calculation process, m starts from 1, at that moment, n is a positive integer larger than 1. Since I, Iout, R1, R2, T2, w, c, φ1, φ2 are all known parameters, L1, L2 and L can be calculated according to the formula (1) to formula (4) above. Since the larger the oscillation period that the light oscillates in the resonant cavity is, the larger the loss to the light is, the values of L1, L2 and L are selected from several groups of values L1, L2 and L to be designed values, the values meet the requirements of L1<L2<L, and the value of the oscillating period m shall be as small as possible.

Figure 17:
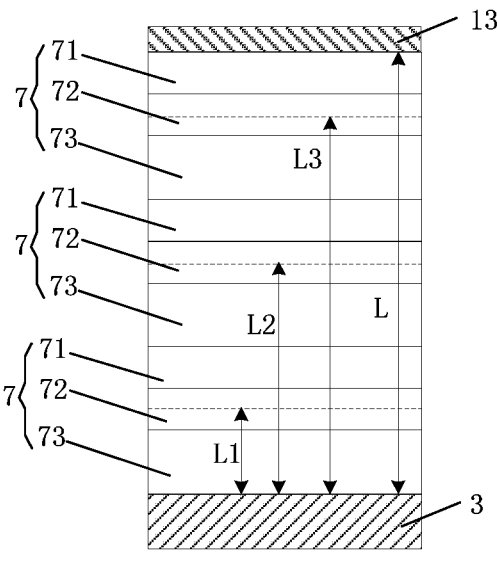

Referring to FIG. 17, the light-emitting device includes three light-emitting units 7, wherein the distance from the emitting layer 3 to the first Bragg mirror 13 is the cavity length L, and the distance from the reflecting layer 3 to the center position of the quantum well layer of the first light-emitting unit 7 is L1, the distance from the reflecting layer 3 to the center position of the quantum well layer of the second light-emitting unit 7 is L2, and the distance from the reflecting layer 3 to the center position of the quantum well layer of the third light-emitting unit 7 is L3.

$$\frac{2wL3}{c} + \varphi1 = (m+2)\pi. \qquad \text{Formula (5)}$$

In the actual simulation calculation process, m starts from 1, at that moment, n is a positive integer larger than 2. Since I, Iout, R1, R2, T2, w, c, φ1, φ2 are all known parameters, L1, L2, L3 and L can be calculated according to the formula (1) to formula (5) above. Since the larger the oscillation period that the light oscillates in the resonant cavity is, the larger the loss to the light is, the values of L1, L2, L3 and L are selected from several groups of values L1, L2, L3 and L to be designed values, the values meet the requirements of L1<L2<L3<L, and the value of the oscillating period m shall be as small as possible.

It should be noted that since the number of cycles of oscillation is smaller, the loss of light is smaller, and the actual light intensity is higher. Generally, the thickness of L1, L2, L3, and L are all micron-sized.

In some embodiments of the present application, the reflecting layer 3 includes a second Bragg mirror, the first Bragg mirror 13 and the second Bragg mirror both include silica sublayers and titanium oxide sublayers disposed alternately.

In an exemplary embodiment, the second Bragg mirror may include twenty sublayers, which includes ten silica sublayers and ten titanium oxide sublayers. The greater the number of sublayers included in the second Bragg mirror, the lower the transmittance and the higher the reflectivity. Since the first Bragg mirror 13 may transmit part of the light and reflect part of the light, the number of sublayers of the first Bragg mirror 13 is less than the number of sublayers of the second Bragg mirror.

The specific number of sublayers of the first Bragg mirror 13 may be determined according to the actual requirements for the transmittance and reflectivity of light, which is not limited here.

Figures 9, 10:
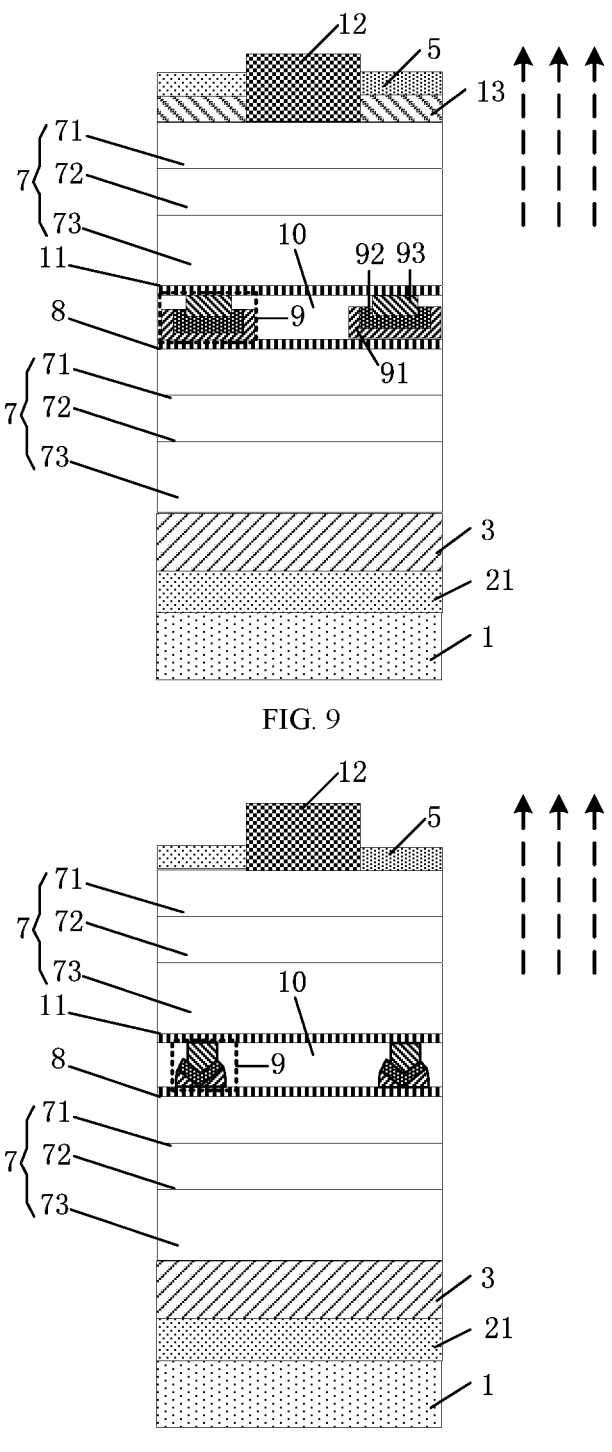

In some embodiments of the present application, as shown in FIG. 9 and FIG. 10, the light-emitting device further includes a first electrode 12 and a metal connecting layer 21, the first electrode 12 is located at a side of the first Bragg mirror 13 away from the substrate 1, and electrically connected to the light-emitting unit 7 through a via hole on the first Bragg mirror 13, the metal connecting layer 21 is located between the reflecting layer 3 and the substrate 1; wherein the reflecting layer 3 and substrate 1 each includes a conductive material, respectively, and the substrate 1 is configured as a second electrode of the light-emitting device, the substrate 1 is electrically connected with light-emitting unit 7 through the metal connecting layer 21 and the reflecting layer 3.

The light-emitting device shown in FIG. 9 and FIG. 10 is a light-emitting device with vertical structure.

In an exemplary embodiment, the metal connecting layer 21 may include a metallic material, and the reflecting layer 3 may include a metallic material, such as silver.

The substrate 1 may be heavily doped with silicon substrate to improve the conductivity of the substrate 1, so that it may be used as an electrode.

It should be noted that in practical applications, the substrate of the light-emitting device is usually removed and then transferred to the driver backplane, however, in the structure shown in FIG. 9 and FIG. 10, since the substrate 1 also serves as an electrode, the substrate 1 needs to be retained.

In some embodiments of the present application, referring to FIG. 1 to FIG. 8, the light-emitting device further includes a first electrode 12, a second electrode 6 and an auxiliary electrode layer 4.

The light-emitting unit 7 and the second electrode 6 are located on the same side of the auxiliary electrode layer 4, and the outer contour of the orthographic projection of the second electrode 6 on the substrate 1 does not overlap with the outer contour of the orthographic projection of the light-emitting unit 7 on the substrate 1, and the second electrode 6 is electrically connected to the light-emitting unit 7 through the auxiliary electrode layer 4.

The auxiliary electrode layer 4 is located between the reflecting layer 3 and the light-emitting unit 7, and the first electrode 12 is located at the side of the first Bragg mirror 13 away from the light-emitting unit 7, and electrically connected to the light-emitting unit 7 via a via hole on the first Bragg mirror 13.

Wherein, the light-emitting device shown in FIG. 1 to FIG. 8 has a normal-mounted structure, at least one electrode is located at the light-emitting side at that moment.

In an exemplary embodiment, the material of the first electrode and the second electrode may be alloys of chromium (Cr), platinum (Pt) and gold (Au).

In an exemplary embodiment, the material of the auxiliary electrode layer 4 is the same as the material of the second semiconductor layer 73.

In an exemplary embodiment, the auxiliary electrode layer 4 may form an integral structure with the second semiconductor layer 73 of the light-emitting unit 7 73, the second semiconductor layer 73 may be N-type gallium nitride (N-GaN).

In an exemplary embodiment, the material of the auxiliary electrode layer 4 is indium tin oxide (ITO).

Figures 11, 12:
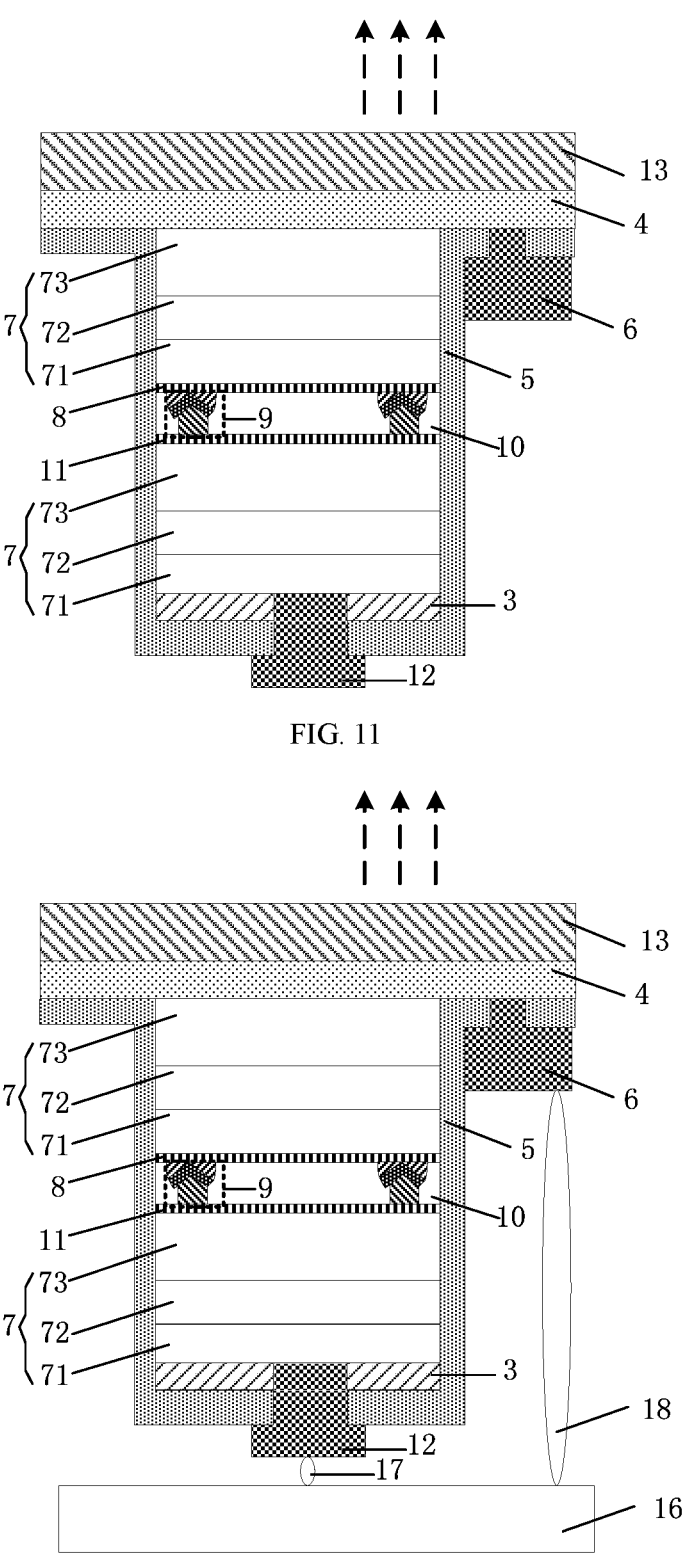
FIG. 12 is a schematic diagram showing the structure that a light-emitting device is bonded on the driving backplane according to an embodiment of the present application.

In some embodiments of the present application, with reference to FIG. 11, the light-emitting device further includes a first electrode 12, a second electrode 6 and an auxiliary electrode layer 4.

The light-emitting unit 7 and the second electrode 6 are located at the same side of the auxiliary electrode layer 4, and the outer contour of the orthographic projection of the second electrode 6 on the substrate 1 does not overlap with the outer contour of the orthographic projection of the light-emitting unit 7 on the substrate 1, and the second electrode 6 is electrically connected to the light-emitting unit 7 through the auxiliary electrode layer 4; The auxiliary electrode layer 4 is located between the first Bragg mirror 13 and the light-emitting unit 7, and the first electrode 12 is located at one side of the reflecting layer 3 away from the light-emitting unit 7, and electrically connected to the light-emitting unit 7 through a via hole on the reflecting layer 3.

Among them, the light-emitting device shown in FIG. 11 has an invert-mounted structure, in which case the electrodes are located on the backlight side.

It is for sure that, the light-emitting devices also include insulation layer 5 and other structures and components, which may be referred to related technologies, and will not be repeated here.

FIG. 12 provides a schematic diagram of the structure of the light-emitting device bound to the driving backplane 16, wherein the first electrode 12 is electrically connected to the driving backplane 16 via a first connection structure 17, the second electrode 6 is electrically connected to the driving backplane 16 by a second connection structure 18.

Figures 19, 20, 21, 22:
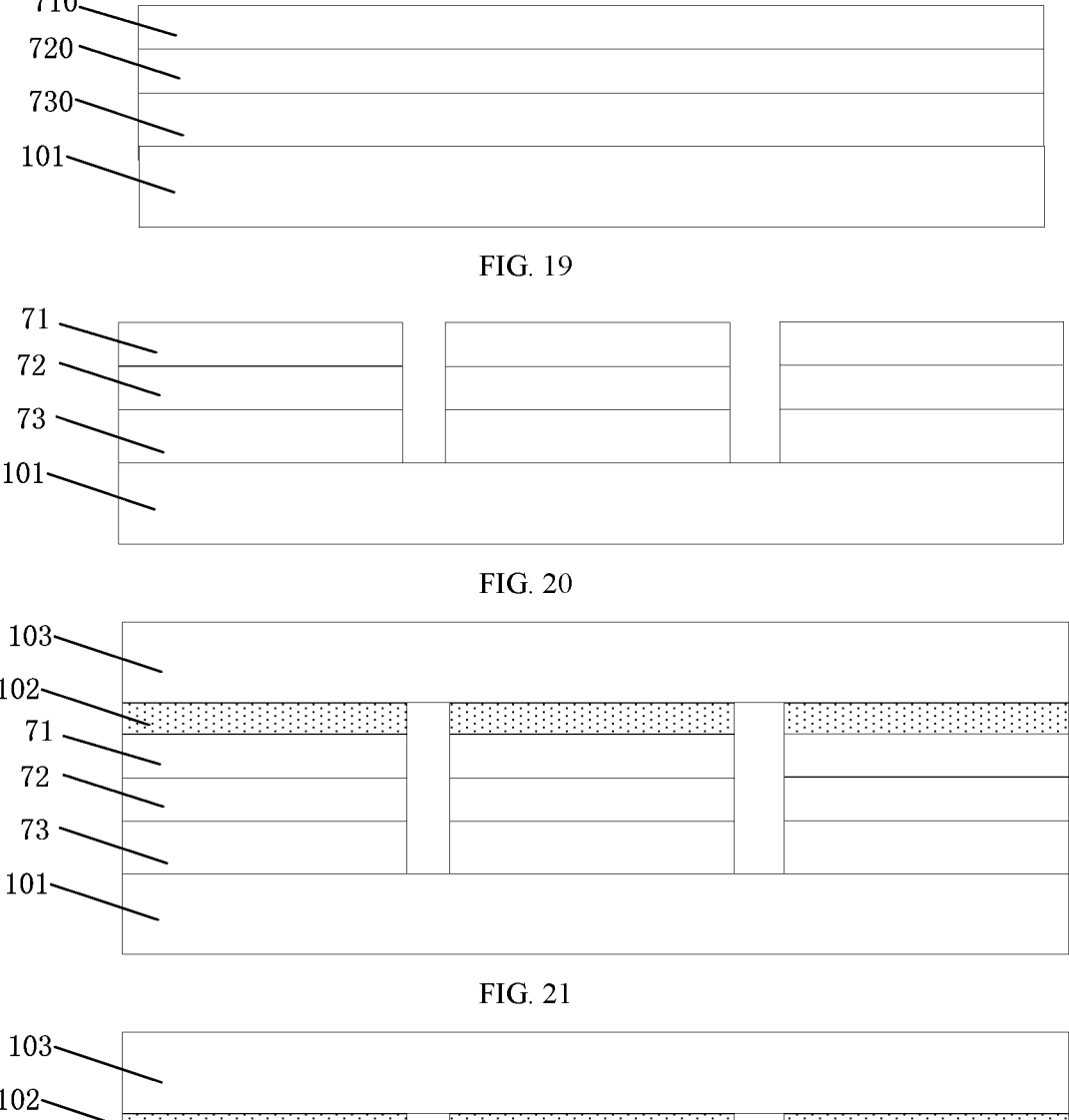
FIG. 19 to FIG. 24 are schematic diagrams showing intermediate structures during the preparation process of the light-emitting device.

Embodiments of the present application also provide a bonding method for each light-emitting unit in a light-emitting device, as follows:

S01, referring to FIG. 19, an extension layer is formed at the first substrate 101, wherein the extension layer includes a semiconductor film 730, a quantum well film 720 and a semiconductor film 710.

S02, referring to FIG. 20, the extension layer is patterned to obtain a plurality of light-emitting units disposed at the same layer, wherein, each light-emitting unit includes a first semiconductor layer 71, a quantum well layer 72 and a second semiconductor layer 73.

S03, forming a temporary bond layer 102 on the first semiconductor layer 71 shown in FIG. 20, the temporary bond layer 102 is shown in FIG. 21, and forming a second substrate 103 on the temporary bond layer 102.

When the light-emitting device is used to electrically connect with the driving backplane, the temporary bonding layer 102 and the second substrate 103 here are removed.

S04, removing the first substrate 101 to obtain the structure shown in FIG. 22.

In practical application, the first substrate 101 may be removed according to the situation, wherein if the first substrate 101 is a sapphire substrate, it may be removed by laser peeling, if the first substrate 101 is a silicon substrate, it may be removed by wet etching process or dry etching process.

Figure 23:
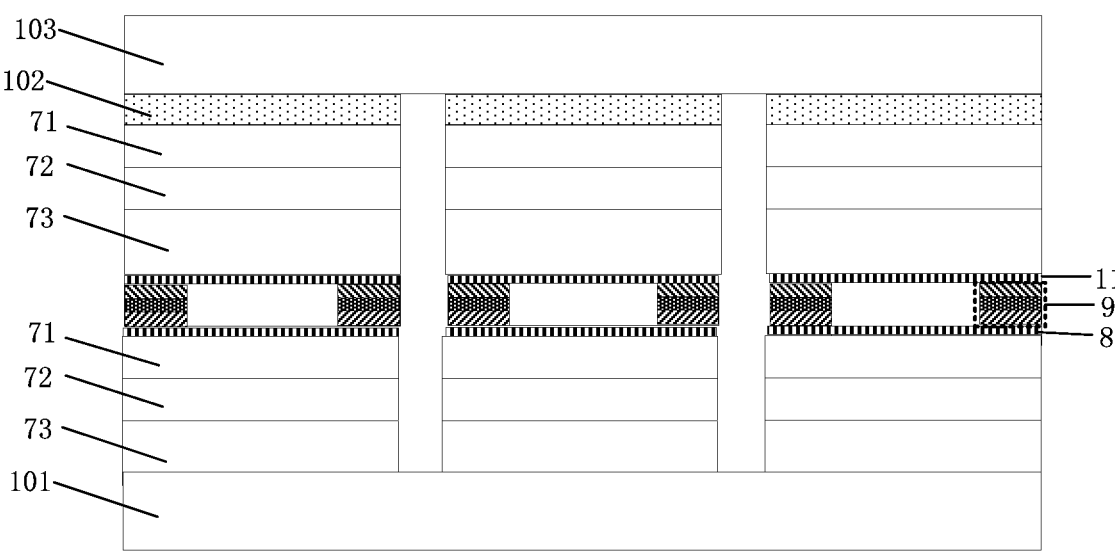

S05, forming the first conducting layer 8 and the second conducting layer 11 on the structure shown in FIG. 22 and a structure shown in FIG. 20, respectively, and the two are bonded together to obtain the structure shown in FIG. 23.

Specifically, a second conducting layer 11 is formed on the structure shown in FIG. 22, a first conducting layer 8 is formed on the structure shown in FIG. 20: a first metal layer of the bonding portion 9 is formed on the first conducting layer 8, and a second metal layer and a middle layer of the bonding portion 9 are formed on a second conducting layer 11, and then the two structures are pressed together so that the first metal layer and the middle layer are in close contact, and then by applying a certain pressure, heating to a certain temperature, and performing thermal insulating for a period of time, so that the eutectic reaction occurs, so as to obtain the first sublayer 91, the second sublayer 92 and the third sublayer 93, the second sublayer 92 is closely combined with the first sublayer 91 and the third sublayer 93, respectively, so as to obtain the structure shown in 23, the principle of bonding may be referred to the previous description, and will not be repeated here.

Figure 24:
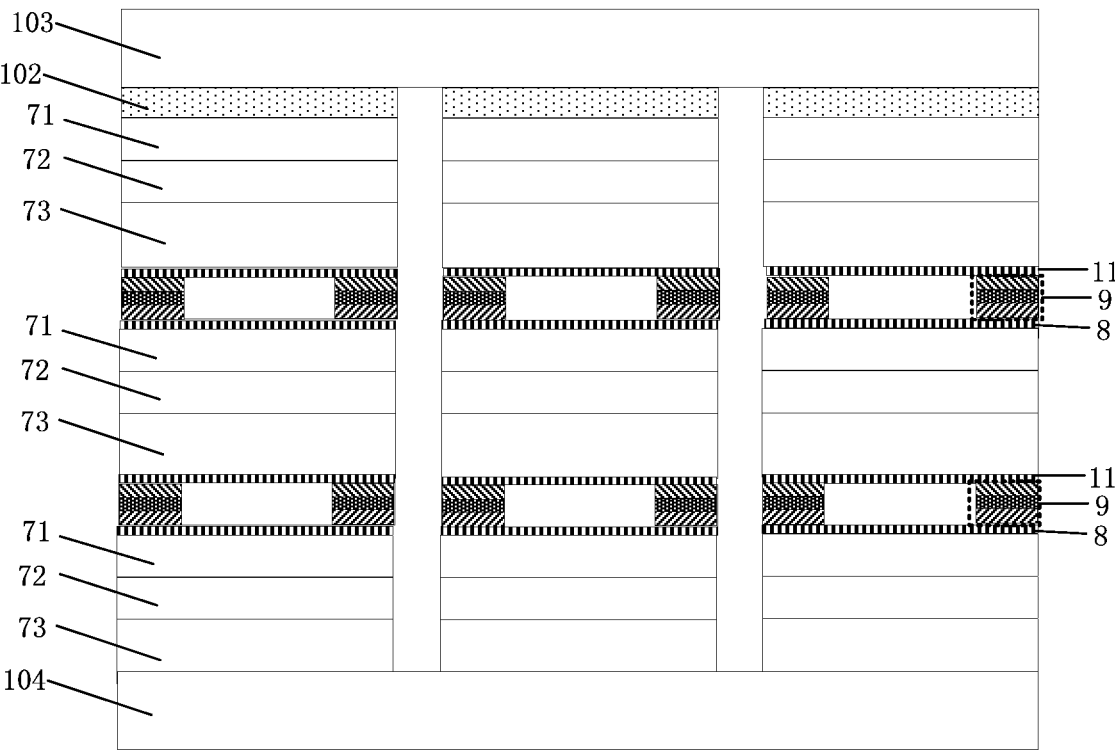

It should be noted that the bonding process of the light-emitting unit here is illustrated by taking the light-emitting device including two stacked light-emitting units as an example. Under the condition that the light-emitting device includes three stacked light-emitting units as shown in FIG. 24, the bonding process is similar to the previous illustration and will not be repeated here.

It should be noted that the light-emitting device prepared by the bonding method provided by the embodiment of the present application further includes other structures and components, and the other structures and components included in the light-emitting device may refer to the description of the light-emitting device in the foregoing, which will not be repeated herein.

Further, embodiments of the present application only describe the bonding process of the light-emitting unit in the light-emitting device related to the core of invention, and the preparation method of other layers and components included in the light-emitting device may refer to the relevant technology, which will not be repeated herein.

In the light-emitting device provided in the embodiments of the present application, by disposing a bonding layer between two adjacent light-emitting units 7 in the direction perpendicular to the plane where the substrate 1 is located, the bonding layer comprises a plurality of spaced bonding portions 9, the light-emitting units 7 is fixed and electrically connected with one another by a bonding layer, and the orthographic projections of the light-emitting units 7 on the substrate 1 overlaps, and therefore, a way to stack a plurality of light-emitting units 7 are provided, which can improve the light output efficiency of light-emitting devices while improving the wavelength uniformity of the emitted light of the light-emitting device, and further improves light-emitting efficiency of the light-emitting device. In the light-emitting device provided according to embodiments of the present application, a plurality of adjacent light-emitting devices 7 along the direction perpendicular to the plane where the substrate 1 is located has the same light-emitting color An embodiment of the present application provides a display apparatus, including a light-emitting device and a driving backplane, the light-emitting device is as described above, the light-emitting device and the driving backplane are electrically connected.

In an exemplary embodiment, the light-emitting device may be used as a backlight device, or, may also be used as a display apparatus.

In an exemplary embodiment, the light-emitting device may be a Mini-LED light-emitting device; alternatively, the light-emitting device may also be a Micro-LED light-emitting device.

In the light-emitting device provided in the embodiments of the present application, by disposing a bonding layer between two adjacent light-emitting units 7 in the direction perpendicular to the plane where the substrate 1 is located, the bonding layer comprises a plurality of spaced bonding portions 9, the light-emitting units 7 is fixed and electrically connected with one another by a bonding layer, and the orthographic projections of the light-emitting units 7 on the substrate 1 overlaps, and therefore, a way to stack a plurality of light-emitting units 7 are provided, which can improve the light output efficiency of light-emitting devices while improving the wavelength uniformity of the emitted light of the light-emitting device.

The above is only specific embodiments of the present application, but the claimed protection scope of the present application is not limited thereto, and any skilled person in the art can easily aware of changes or replacements within the scope of the technology disclosed in the present application, and the changes and replacements should be covered by the claimed protection scope of this application. Therefore, the claimed protection scope of the present application shall be subject to the claimed protection scope of the claims.

The invention claimed is:

1. A light-emitting device, comprising:

a substrate;

at least two light-emitting units, wherein, in a direction perpendicular to the plane where the substrate is located, orthographic projections of two adjacent light-emitting units on the substrate overlap; and at least one patterned bonding layer, located between two adjacent light-emitting units, wherein the patterned bonding layer comprises a plurality of spaced bonding portions, the bonding portions are configured to be able to fix and electrically connect the two adjacent light-emitting units; wherein an orthographic projection of the bonding portion on the substrate is located within the orthographic projection of the light-emitting unit on the substrate, and the sum of areas of the orthographic projections of all the bonding portions on the substrate is less than the area of an orthographic projection of a light-emitting surface of the light-emitting device on the substrate, wherein the bonding portion comprises a first sublayer and a second sublayer, and a material of the first sublayer and a material of the second sublayer are configured to be able to diffuse into the each other under a first preset condition; and at least part area of the interface between the first sublayer and the second sublayer has a preset angle with the plane where the substrate is located, and the preset angle is larger than 0° and less than 180°.

2. The light-emitting device according to claim 1, wherein the sum of the areas of the orthographic projections of all the bonding portions on the substrate is less than or equal to 50% of the area of the orthographic projection of the light-emitting surface of the light-emitting device on the substrate.

3. The light-emitting device according to claim 1, wherein the light-emitting device further comprises a plurality of light-transmitting portions, and one of the light-transmitting portions fills the space between two adjacent bonding portions.

4. The light-emitting device according to claim 1, wherein the light-emitting device comprises two light-emitting units and one bonding layer;

or the light-emitting device comprises at least three light-emitting units and at least two bonding layers; wherein orthographic projections of the bonding layers on the substrate overlap with each other.

5. The light-emitting device according to claim 1, wherein, under the condition that the material of the first sublayer and the material of the second sublayer are the same, the material of the first sublayer and the material of the second sublayer are any one of gold, copper and aluminum; and under the condition that the material of the first sublayer and the material of the second sublayer are different, the material of the first sublayer is silver, and the material of the second sublayer is gold.

6. A light-emitting device, comprising:

a substrate;

at least two light-emitting units, wherein, in a direction perpendicular to the plane where the substrate is located, orthographic projections of two adjacent light-emitting units on the substrate overlap; and at least one patterned bonding layer, located between two adjacent light-emitting units, wherein the patterned bonding layer comprises a plurality of spaced bonding portions, the bonding portions are configured to be able to fix and electrically connect the two adjacent light-emitting units;

wherein an orthographic projection of the bonding portion on the substrate is located within the orthographic projection of the light-emitting units on the substrate, and the sum of areas of the orthographic projections of all the bonding portions on the substrate is less than the area of an orthographic projection of a light-emitting surface of the light-emitting device on the substrate, wherein the bonding portion comprises a first sublayer, a second sublayer and a third sublayer, the second sublayer is located between the first sublayer and the third sublayer, a material of the first sublayer is the same as a material of the third sublayer, and a material of the second sublayer is configured to form eutectic crystals with the material of the first sublayer and the material of the third sublayer, respectively, under a second preset condition.

7. The light-emitting device according to claim 6, wherein an interface between the first sublayer and the second sublayer is a first interface, an interface between the second sublayer and the third sublayer is a second interface, and the first interface and the second interface are parallel.

8. The light-emitting device according to claim 7, wherein the first interface is parallel to the plane where the substrate is located;

or, at least part area of the first interface has a preset angle with the plane where the substrate is located, and the preset angle is larger than 0° and less than 180°.

9. The light-emitting device according to claim 8, wherein under the condition that a preset angle exists between at least part area of the first interface and the plane where the substrate is located, an outer contour of an orthographic projection of the third sublayer on the substrate is located within an outer contour of an orthographic projection of the second sublayer on the substrate, and an orthographic projection of the second sublayer on the substrate is located within an orthographic projection of the first sublayer on the substrate.

10. The light-emitting device according to claim 9, wherein each of the first sublayer and the second sublayer has a U-shape section in the direction perpendicular to the plane where the substrate is located, and the third sublayer has a rectangular section in the direction perpendicular to the plane where the substrate is located.

11. The light-emitting device according to claim 9, wherein the first sublayer has an arc-shaped section in the direction perpendicular to the plane where the substrate is located, the second sublayer has a hexagonal section in the direction perpendicular to the plane where the substrate is located, and the third sublayer has a pentagonal section in the direction perpendicular to the plane where the substrate is located.

12. The light-emitting device according to claim 6, wherein a material of the first sublayer and a material of the third sublayer are any one of gold, silver, platinum, tin and copper, and a material of the second sublayer is tin or indium; and under the condition that the material of the second sublayer is tin, the material of the first sublayer and the material of the third sublayer are any one of gold, silver and copper; and under the condition that the material of the second sublayer is indium, the material of the first sublayer and the material of the third sublayer are any one of gold, silver, platinum and tin.

13. The light-emitting device according to claim 1, wherein the light-emitting device further comprises a first conducting layer located between one of the light-emitting units and the bonding portion, and a second conducting layer located between another one of the light-emitting units and the bonding portion, the bonding portion is electrically connected to one of the light-emitting units via the first conducting layer, and the bonding portion is electrically connected to another one of the light-emitting units via the second conducting layer.

14. The light-emitting device according to claim 13, wherein the light-emitting device further comprises a first auxiliary layer located between the first conducting layer and the bonding portion, and a second auxiliary layer between the second conducting layer and the bonding portion, and the first auxiliary layer and the second auxiliary layer are configured to be able to improve the adhesion between the bonding portion and the first conducting layer and the adhesion between the bonding portion and the second conducting layer.

15. The light-emitting device according to claim 1, wherein the light-emitting device further comprises a reflecting layer and a first Bragg mirror, and the light-emitting units are located between the reflecting layer and the first Bragg mirror; and in the direction perpendicular to the plane where the substrate is located, the distance between the reflecting layer and a light-emitting surface of the light-emitting device is larger than the distance between the first Bragg mirror and the light-emitting surface of the light-emitting device, and the first Bragg mirror is configured to be able to reflect part of light and transmit part of the light.

16. The light-emitting device according to claim 15, wherein the reflecting layer comprises a second Bragg mirror, and each of the first Bragg mirror and the second Bragg mirror comprises a silicon oxide sublayer and a titanium oxide sublayer disposed alternately.

17. A display apparatus, comprising a light-emitting device and a driving backplane, wherein the light-emitting device is the light-emitting device according to claim 1, and the light-emitting device and the driving backplane are electrically connected with each other.

18. A display apparatus, comprising a light-emitting device and a driving backplane, wherein the light-emitting device is the light-emitting device according to claim 9, and the light-emitting device and the driving backplane are electrically connected with each other.

19. The light-emitting device according to claim 6, wherein the sum of the areas of the orthographic projections of all the bonding portions on the substrate is less than or equal to 50% of the area of the orthographic projection of the light-emitting surface of the light-emitting device on the substrate.

20. The light-emitting device according to claim 6, wherein the light-emitting device further comprises a plurality of light-transmitting portions, and one of the light-transmitting portions fills the space between two adjacent bonding portions.

* * * * *